(12) United States Patent
Wang et al.

(10) Patent No.: US 10,716,402 B2
(45) Date of Patent: Jul. 21, 2020

(54) WALL MOUNT ASSEMBLY

(71) Applicants: ShenZhen Hongfei Precision Technology Co., Ltd., Shenzhen (CN); HON HAI PRECISION INDUSTRY CO., LTD., New Taipei (TW)

(72) Inventors: Wen-Pin Wang, New Taipei (TW); Yao-Shih Chung, New Taipei (TW); Shih-Hong Fu, New Taipei (TW)

(73) Assignees: ShenZhen Hongfei Precision Technology Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/238,539

(22) Filed: Jan. 3, 2019

(65) Prior Publication Data

US 2019/0200762 A1    Jul. 4, 2019

Related U.S. Application Data

(60) Provisional application No. 62/613,207, filed on Jan. 3, 2018.

(51) Int. Cl.
*A47B 97/00* (2006.01)
*F16M 13/02* (2006.01)
(Continued)

(52) U.S. Cl.
CPC .............. *A47B 97/001* (2013.01); *F16B 1/00* (2013.01); *F16M 11/041* (2013.01);
(Continued)

(58) Field of Classification Search
CPC .. A47B 97/001; F16B 1/00; F16B 2001/0035; F16M 11/041; F16M 11/105;
(Continued)

(56) References Cited

U.S. PATENT DOCUMENTS 7,117,621 B2 * 10/2006 Chang .................. A47G 1/0616
40/738
2004/0047052 A1 * 3/2004 Zadro .................... A45D 42/16
359/855

(Continued)

FOREIGN PATENT DOCUMENTS

| CN | 105357920 A | 2/2016 |
|---|---|---|
| TW | M461976 | 9/2013 |
| WO | 2012142779 A1 | 10/2012 |

*Primary Examiner* — Anita M King
(74) *Attorney, Agent, or Firm* — ScienBiziP, P.C.

(57) ABSTRACT

The present disclosure provides a rear structure coupled to a display panel. The rear structure comprises a wall mount assembly comprising a first kit comprising a first wall mount bracket, a plurality of circularly arranged first trenches, and a plurality of first magnets accommodated by the first trenches, and a second kit removably coupled to the first kit comprising a second wall mount bracket structurally complementary to the first wall mount bracket, a plurality of circularly arranged second trenches, and a plurality of second magnets accommodated by the second trenches. Wherein when the first kit is coupled to the second kit, each of the first magnets is located corresponds to one of the second magnets, and a magnetism of a side of one of the first magnets facing the second kit is opposite to a magnetism of a side of one of the second magnets facing the first kit.

16 Claims, 14 Drawing Sheets

(51) Int. Cl.

|  |  |
|---|---|
| *H05K 5/00* | (2006.01) |
| *F16B 1/00* | (2006.01) |
| *F16M 11/04* | (2006.01) |
| *F16M 11/10* | (2006.01) |
| *G02F 1/1333* | (2006.01) |
| *H05K 5/02* | (2006.01) |
| *H05K 5/03* | (2006.01) |

(52) U.S. Cl.
CPC .......... *F16M 11/105* (2013.01); *F16M 13/02* (2013.01); *F16M 13/022* (2013.01); *G02F 1/133308* (2013.01); *H05K 5/0017* (2013.01); *H05K 5/0204* (2013.01); *H05K 5/0217* (2013.01); *H05K 5/03* (2013.01); *F16B 2001/0035* (2013.01); *G02F 2001/133314* (2013.01)

(58) Field of Classification Search
CPC .................. F16M 13/02; F16M 13/022; G02F 1/133308; G02F 2001/133314; H05K 5/0017; H05K 5/0204; H05K 5/0217; H05K 5/03
See application file for complete search history.

(56) References Cited

U.S. PATENT DOCUMENTS

| | | | |
|---|---|---|---|
| 2006/0237604 A1* | 10/2006 | Tan | B60R 11/0235 248/205.3 |
| 2019/0208651 A1* | 7/2019 | Wang | A47B 97/001 |
| 2019/0289729 A1* | 9/2019 | Nguyen | H05K 5/0217 |

* cited by examiner

WALL MOUNT ASSEMBLY

CROSS-REFERENCE TO RELATED APPLICATIONS

This application claims priority to U.S. Provisional Application No. 62/613,207 filed on Jan. 3, 2018, which is hereby incorporated by reference in its entirety.

FIELD

The present disclosure provides a rear structure and for a display panel. Specifically, the present disclosure provides a rear cover and a wall mount assembly for supporting the display panel.

BACKGROUND OF THE INVENTION

Display panels have been widely used in televisions, laptops, tablets, or other electronics for conveying information, displaying graphics, video, or texts. The display panel may be coupled to a rear structure to form a display apparatus. For the convenience of the viewer, the display apparatus may be coupled to a rack or a mount, and then installed onto a corner, onto a wall, on a desk, or on a flat surface.

The coupling between the rack and the display apparatus is often permanent or semi-permanent: screws and nuts may be needed to install or remove the display apparatus from the rack. If the viewer wishes to move the display apparatus to another position or remove the current rack from the wall/corner/desk/flat surface, this configuration is rather immobile and inconvenient.

Therefore, there is a need to provide a solution for removably coupling the display apparatus and the rack. The coupling between the display apparatus and the rack must also be firm.

SUMMARY OF THE INVENTION

It is an object of the present disclosure to provide a coupling and releasing mechanism for the display apparatus to be coupled to a rack or a wall.

The present disclosure provides a rear structure coupled to a display panel. The rear structure comprises a wall mount assembly comprising a first kit comprising a first wall mount bracket, a plurality of circularly arranged first trenches, and a plurality of first magnets accommodated by the first trenches, and a second kit removably coupled to the first kit comprising a second wall mount bracket structurally complementary to the first wall mount bracket, a plurality of circularly arranged second trenches, and a plurality of second magnets accommodated by the second trenches. Wherein when the first kit is coupled to the second kit, each of the first magnets is located corresponds to one of the second magnets, and a magnetism of a side of one of the first magnets facing the second kit is opposite to a magnetism of a side of one of the second magnets facing the first kit.

In a preferred embodiment, the first wall mount bracket further comprises a plurality of protrusions and a plurality of positioning pins housed by the protrusions, and the second wall mount bracket further comprises a plurality of recesses structurally complementary to the positioning pins.

In a preferred embodiment, when the first kit is coupled to the second kit, each of the positioning pins fits into each of the recesses.

In a preferred embodiment, the first wall mount bracket further comprises a plurality of first matching structures, and the second wall mount bracket further comprises a plurality of second matching structures.

In a preferred embodiment, when the first kit is coupled to the second kit, each of the first matching structures is aligned with each of the second matching structures.

In a preferred embodiment, when the first kit is separated from the second kit, the first kit is rotated against the second kit for a degree so that the sides of the first magnets facing the second kit are shifted to face the second magnets having identical magnetisms.

In a preferred embodiment, at least two of the first magnets and the second magnets are grouped into one section. The first magnets and the second magnets are grouped into a plurality of the sections, and the sections are spaced apart from each other by a distance that is longer than or equal to the length of one of the first magnets of the second magnets.

In a preferred embodiment, magnetisms of any two adjacent magnets within the section is different.

DETAILED DESCRIPTION

Figure 1A:
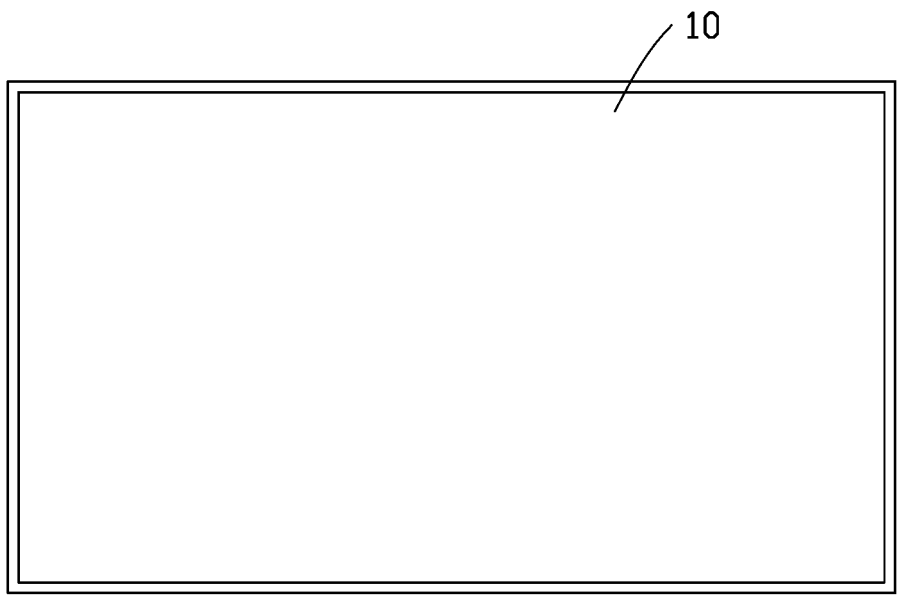
FIG. 1A is a front view of a display apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts can be exaggerated to better illustrate details and features. The description is not to be considered as limiting the scope of the embodiments described herein. Alterations and further modifications of the inventive features illustrated here, and additional applications of the principles of the inventions as illustrated here, which would occur to one skilled in the relevant art and having possession of this disclosure, are to be considered within the scope of the invention.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The connection can include, but is not limited to, mechanical, electrical, and magnetic connections. The term "comprising" means "including, but not necessarily limited to"; it specifically indicates open-ended inclusion or membership in a so-described combination, group, series, and the like.

Figure 1B:
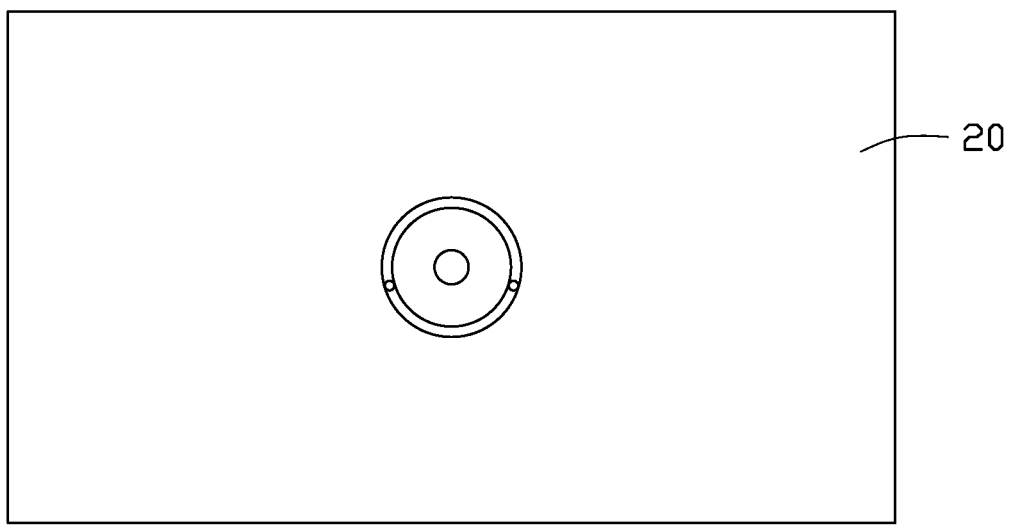
FIG. 1B is a rear view of the display apparatus, in accordance with an embodiment of the present disclosure.
Figure 2:
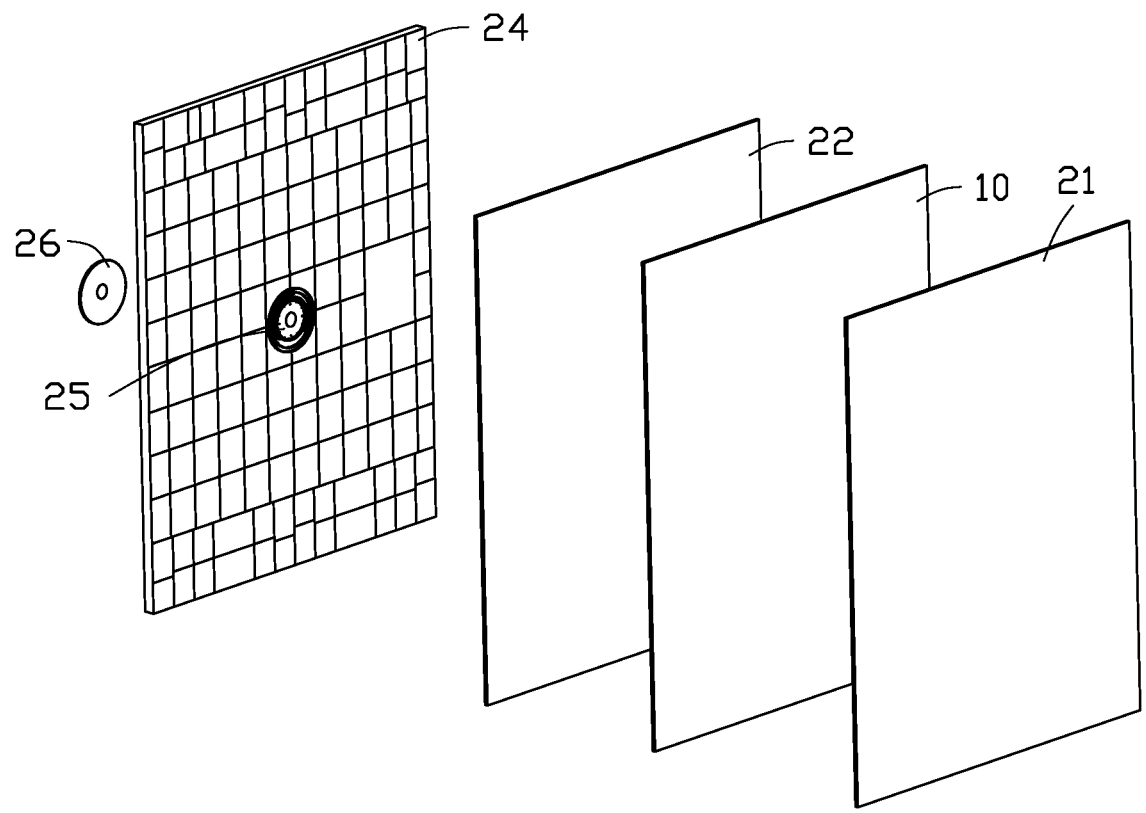
FIG. 2 is an exploded view of the rear structure and the display panel, in accordance with an embodiment of the present disclosure.

FIGS. 1A and 1B illustrate a front view and a rear view of a display apparatus, in accordance with an embodiment of the present disclosure. The display apparatus comprises a display panel 10 installed with a rear structure 20, The term "front" refers to a position or a side directly facing the viewer when the display panel 10 is displaying information to the viewer. The term "rear" refers to a position or a side that is opposite to the front. The display panel 10 can be a flat display panel, and preferably a LCD panel. The rear structure 20 can only be seen from the rear side, as illustrated in FIG. 1B. FIG. 2 illustrates an exploded view of the rear structure 20 and the display panel 10, in accordance with an embodiment of the present disclosure. As illustrated in the exploded view in FIG. 2, the rear structure 20 comprises a front bezel 21 on the front for coupling with the display panel 10, a backlight module 22 on a rear side the display panel 10, a rear cover 24 coupled to the backlight module 22, a wall mount assembly 25 at a center of the rear cover 24, and a plastic cover 26 on the rear side of the wall mount assembly 25 and coupled to the wall mount assembly 25.

Figure 3:
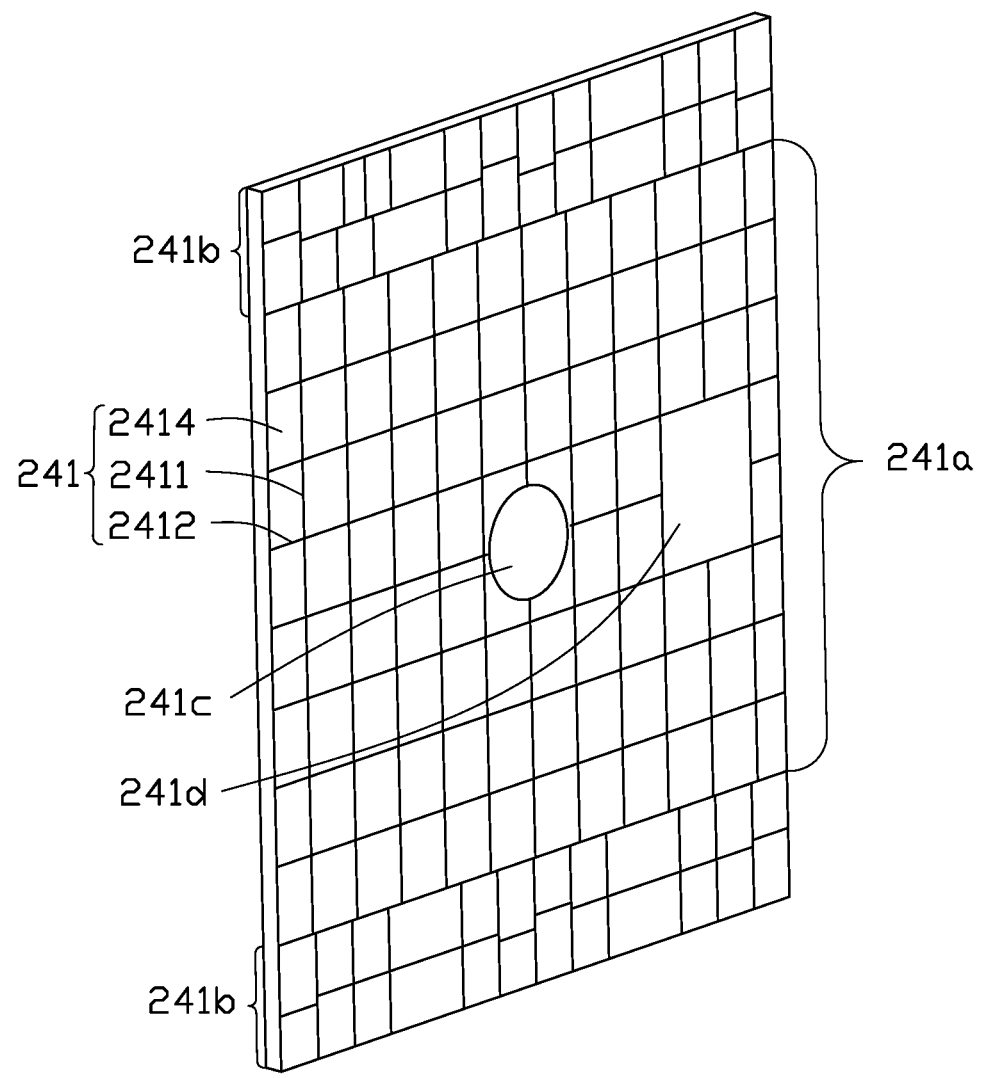
FIG. 3 is a perspective view of a rear cover, in accordance with an embodiment of the present disclosure.

FIG. 3 illustrates a perspective view of the rear cover 24, in accordance with an embodiment of the present disclosure. The rear cover 24 of the rear structure 20, as illustrated in FIG. 3, includes a rib structure 241. The rib structure 241 is formed by a plurality of horizontal bars 2411 and vertical bars 2412 to provide support to the display panel 10. The rib structure 241 strengthens the overall structure of the rear cover 24 without increasing the weight.

In the embodiment as illustrated in FIG. 3, at least a first section 241a of the rib structure 241 comprising aligned adjacent horizontal bar(s) 2411, and the first section 241a comprising aligned adjacent vertical bar(s) 2412. In other words, at least some of the horizontal bars 2411 and the vertical bars 2412 form a plurality of continuous lines in the first section 241a across the rib structure 241.

In another embodiment as illustrated in the left and right sides of FIG. 3, at least a second section 241b of the rib structure 241 comprising non-aligned horizontal bars 2411; in other words, one of any two adjacent horizontal bars 2411 is parallelly dislocated with respect to the other horizontal bar 2411 in the second section 241b. Some of the horizontal bars 2411 in the second section 241b does not form a continuous line with another horizontal bar 2411. Likewise, some of the vertical bars 2412 in the second section 241b may also be unaligned with their adjacent vertical bars 2412. That is to say, some of the vertical bars 2412 in the second section 241b does not form a continuous line with another vertical bars 2412. The horizontal bar 2411 and the vertical bar 2412 are crossed to form a block 2414. The areas of the blocks 2414 may be identical in the first section 241a, or the areas of the blocks 2414 may vary in the second section 241b. When the rear structure 20 is coupled to the display panel 10, the blocks 2414 will form a plurality of interior spaces between the rear cover 24 and the display panel 10, and the interior spaces may be used to accommodate electronic components of the display panel 10. Therefore, the electronic components of the display panel 10 can be properly housed by the interior spaces.

In yet another embodiment as illustrated in the lower center of FIG. 3, some of the bars 2411 and 2412 may be removed, as seen in a third section 241c and a fourth section 241d. This arrangement can reduce weight of the rear cover 24, and can provide space to accommodate electronic components of the display panel 10.

Figure 4:
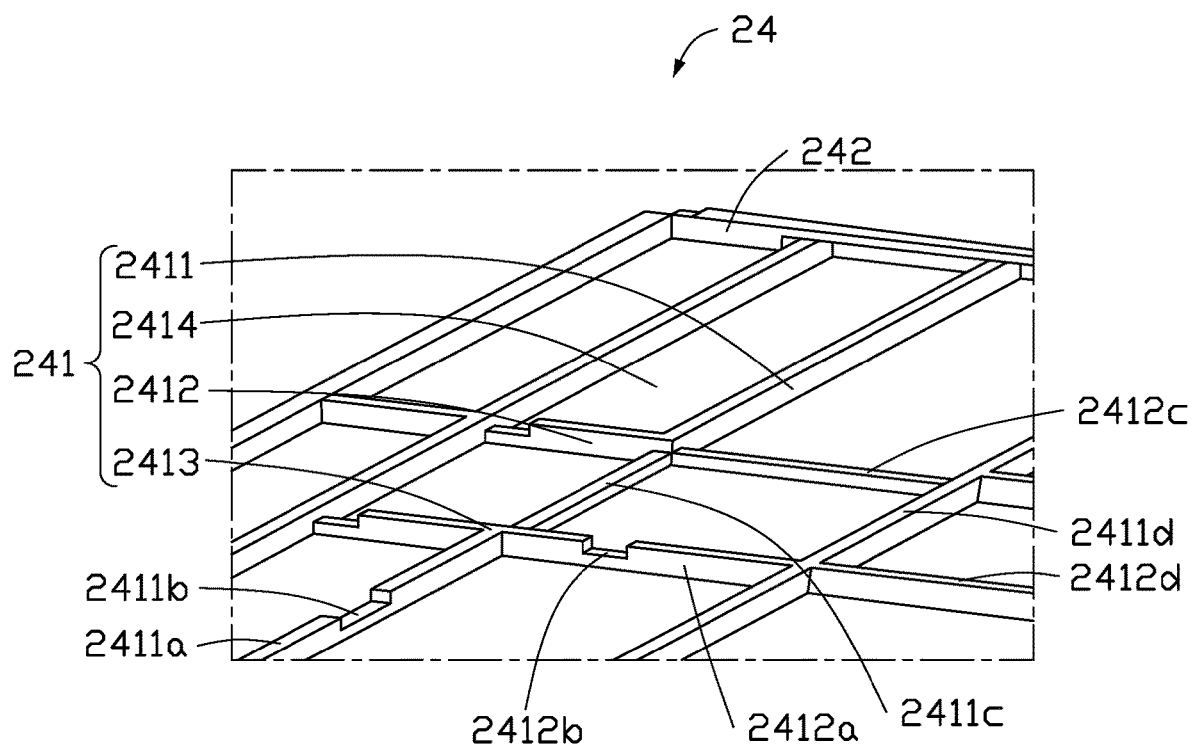
FIG. 4 is a perspective view of a rib structure, in accordance with an embodiment of the present disclosure.

FIG. 4 illustrates a perspective view of the rib structure 241, in accordance with an embodiment of the present disclosure. Widths, lengths and heights of the bars 2411 and 2412 of the rib structure 241 may vary according to different applications. For example, the size of the display panel 10 may be relevant to the heights and lengths of the bars 2411 and 2412: the larger the display panel 10 is, the higher or longer the bars 2411 and 2412 are. Preferably, the height of each of the bars 2411 and 2412 is at least 0.2 mm. The height of each portion of each of the bars 2411 may differ, with some portions of the bars 2411 may be elevated and some may be lowered. Some portions of the vertical bar 2414 may have different heights than the rest of the portions of the vertical bar 2414. Elevated portions of the vertical bar 2412a may be arranged next to lowered portions of the vertical bar 2412b. Two of the lower portions 2412b in the same block 2414 can be a passage for wires or the electronic components of the display panel 10 to cross neighboring blocks 2414. A corner structure 2413 for enhancing a structural strength of the rib structure 241 is at an intersection between the horizontal bars 2411 and the vertical bars 2412, and the corner structure 2413 may be next to the lower portion 2412b or the elevated portion 2412a. Some portions of the horizontal bar 2414 may also have different heights than the rest of the portions of the horizontal bar 2414. An elevated portion of the horizontal bar 2411a may be arranged next to a lowered portion of the horizontal bar 2411b. Two of the lower portions 2411b in the same block 2414 can also be a passage for wires of the electronic components of the display panel 10 to cross neighboring blocks 2414.

Some of the horizontal bars may have different height than the rest of the horizontal bars, and some of the vertical bars may have different height than the rest of the vertical bars. In FIG. 4, a horizontal bar 2411c has a lower height than horizontal bars 2411d, and a vertical bar 2412c has a lower height than the vertical bars 2412d. The block 2414 bordered by at least one lower height bars may be used to accommodate larger electronic components of the display panel 10, or that many such blocks 2414 can collectively accommodate a large electronic component of the display panel 10. The rib structure may comprise bars with different heights, or a bar with several portions of different heights within a bar.

Figure 5:
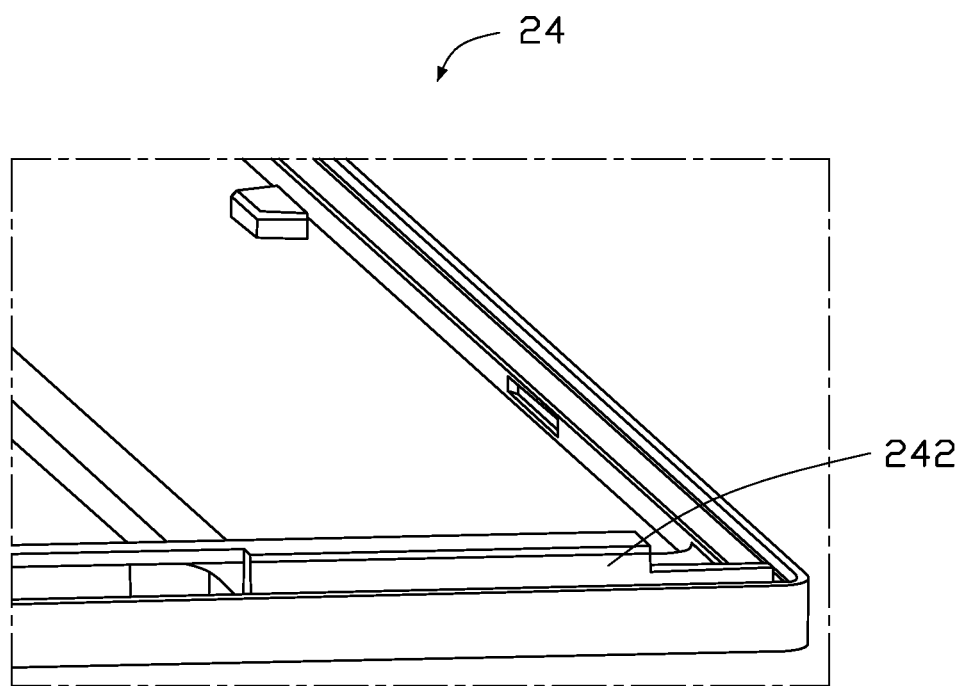
FIG. 5 is a perspective view of a support frame, in accordance with an embodiment of the present disclosure.

FIG. 5 illustrates a perspective view of a support frame 242, in accordance with an embodiment of the present disclosure. The rear cover 24 may further include the support frame 242, as illustrated in FIG. 5. The support frame 242 is disposed along four sides and corners of the rear cover 24 and is connected to the rib structure 241. The display panel 10 may be attached (or adhered) to the support frame 242. When the display panel 10 is attached to the support frame 242, the blocks 2414 on the back of the display panel 10 provides a plurality of spaces for accommodating the electronic components of the display panel 10. The frame support 242 supports and strengthens one or more edges of the display panel 10.

Figure 6:
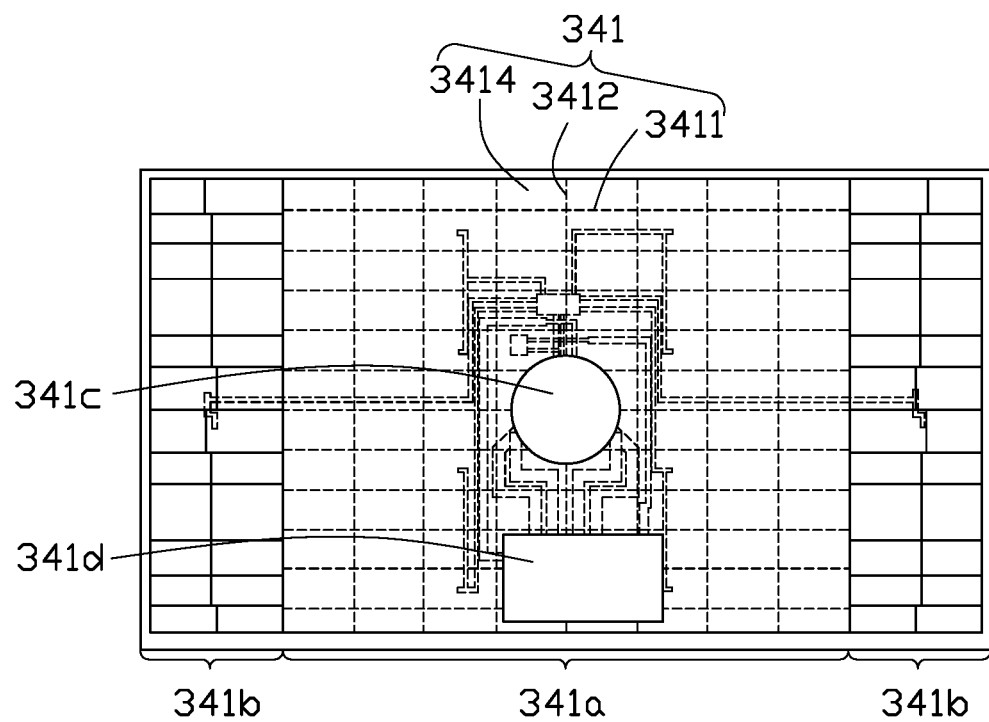
FIG. 6 is a rear view of a rear cover of another rear structure, in accordance with an embodiment of the present disclosure.

FIG. 6 is a rear view of a rear cover 34 of a rear structure 30, in accordance with an embodiment of the present disclosure. As illustrated in FIG. 6, since the length and arrangement of bars 3411 and 3412 of a rib structure 341 may vary, and some of the bars 3411 and 3412 may be removed to form a third section 341c and a fourth section 341d in the rear cover 34, the blocks 3414 within the rib structure 341 may be of different sizes to accommodate electronic components of various sizes. Some of the bars 3411 and 3412 are removed to form the third section 341c and the fourth section 341d. A first section 341a is consisted of 8 sub-sections, and each of the sub-sections is consisted of at least 6 identical blocks 3414: for sub-sections adjacent to the third section 341c and the fourth section 341d, there are only 6 identical blocks 3414; for sub-sections not in contact with the first section 341a and the second section 341b, there are 8 identical blocks 3414 within the sub-section. A second section 341b is consisted of 2 sub-sections, areas of the blocks 3414 are not identical, and the vertical bars 3412 may be paralleled but not aligned with each other.

Because the heights of the bars 3411 and 3412 of the rib structure 341 may vary, the bars 341 in the rib structure 341 may have different heights at different portions of the rear cover 34. For example, the rear cover 34 is divided into the plurality of blocks 3414 within which the bars 3411 and 3412 have either a maximum rib height H, or different reduced rib heights (for example, 0.5H, 0.3H or 0.1H). The dotted lines in FIG. 6 are bars 3411 and 3411 of reduced bar heights, and the solid lines are bars 3411 and 3412 of maximum rib heights. Reduced bar height surrounding a given block 3414 can be selected, for example, based on different types of electronic components housed in the area.

Furthermore, a part of the bars 2411, 2412, 3411, or 3412 of the rib structure 241 or 341 may be reinforced with carbon fiber. For example, the bars around larger blocks 2414 or 3414 on the rib structure 241 or 341 may be reinforced to provide an evenly distributed support for the display panel 10. In other embodiments, the bars 2411, 2412, 3411, or 3412 close to the control board or printed circuit board (PCB) of the display panel may be reinforced to provide additional support and protection.

Figure 7:
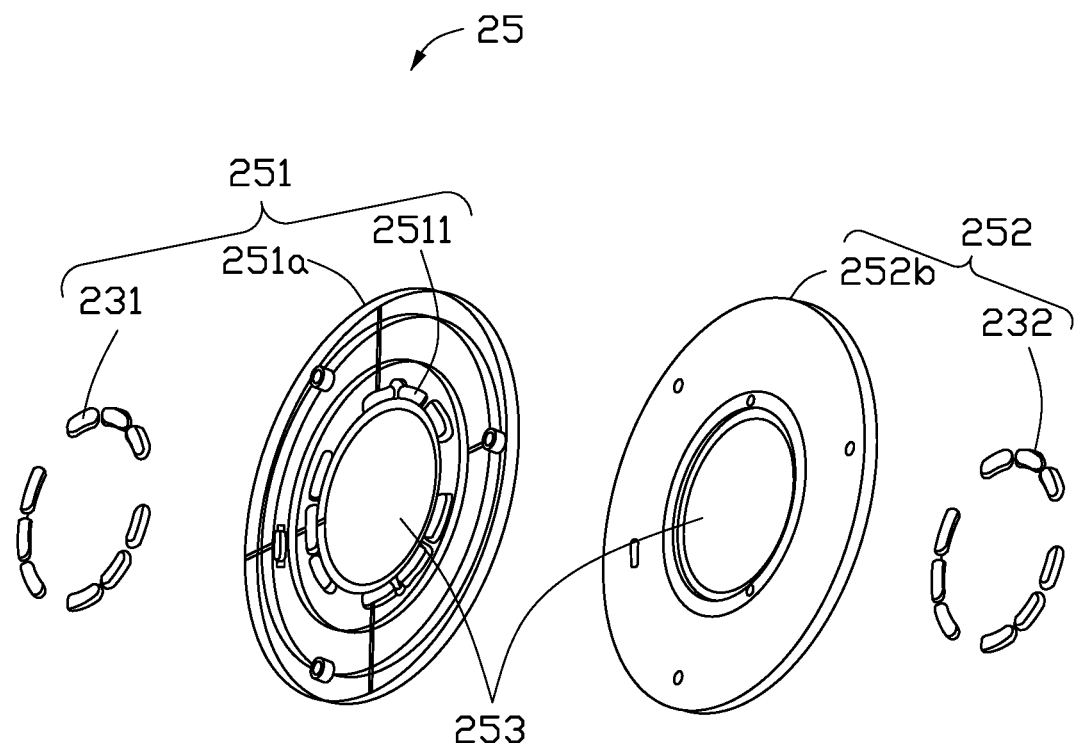
FIG. 7 is an exploded view of a wall mount assembly, in accordance with an embodiment of the present disclosure.

FIG. 7 is an exploded view of the wall mount assembly 25, in accordance with an embodiment of the present disclosure. The wall mount assembly 25 of the rear structure 20 in FIG. 7 is generally round, but can also be triangle, rectangle, or other polygon in other embodiments. The wall mount assembly 25 includes a first kit 251 and a second kit 252. The first and second kit 251 and 252 are structurally complementary and can be removably coupled to each other. The first kit 251 comprises a first wall mount bracket 251a and a plurality of first magnets 231. The second kit 252 comprises a second wall mount bracket 252b and a plurality of second magnets 232. In FIG. 7, a first side of the first wall mount bracket 251a can be coupled to a second side of the second wall mount bracket 252b, and coupling may form a central hole 253 within the wall mount assembly 25. The first wall mount bracket 251a and the second wall mount bracket 252b can also be of identical size and structurally similar, or the first wall mount bracket 251a and the second wall mount bracket 252b can be of different sizes. One of the first kit 251 and second kit 252 is to be disposed on a mount base fixed to a wall (not shown), a rack (not shown), or the plastic cover 26 (as shown in FIG. 2), and the other is to be disposed on the rear cover 24 of the rear structure 20, thereby allowing the display panel 10 to be removably attached to the wall.

Figure 8A:
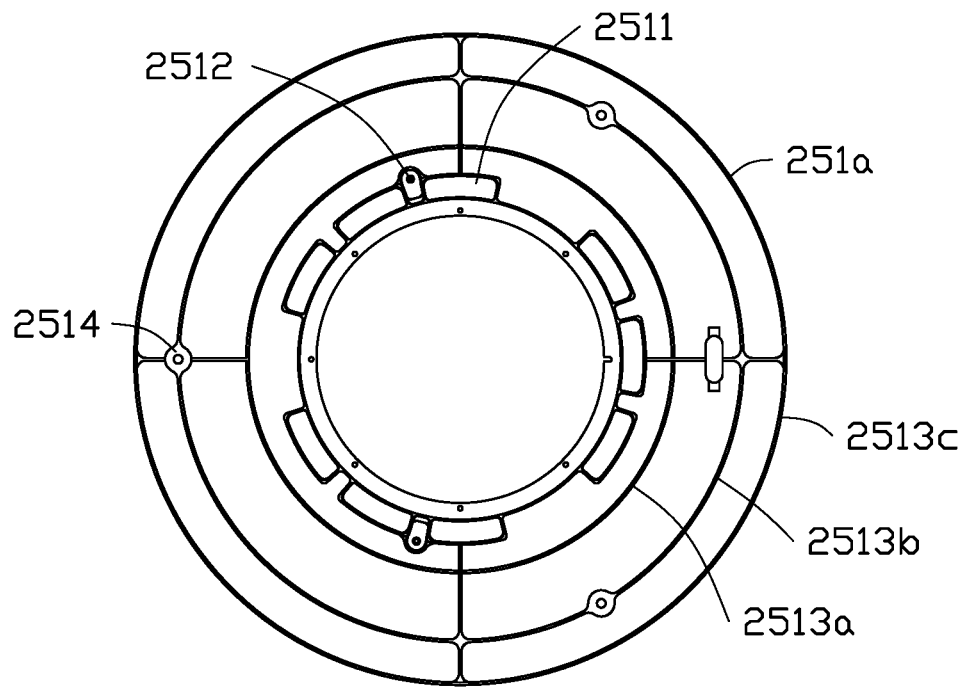
FIG. 8A is a first side of a wall mount bracket of a first kit, in accordance with an embodiment of the present disclosure.
Figure 8B:
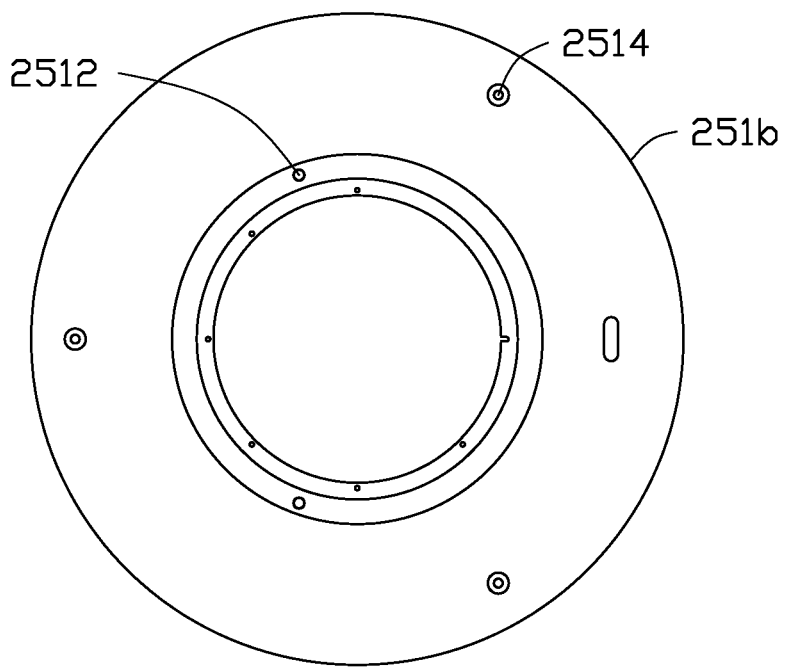
FIG. 8B is a second side of the wall mount bracket of the first kit, in accordance with an embodiment of the present disclosure.

FIGS. 8A and 8B illustrate a first side and the second side of the first wall mount bracket 251a of the first kit 251, in accordance with an embodiment of the present disclosure. As shown in FIG. 8A, a first side of the first wall mount bracket 251a includes a plurality of circularly arranged first trenches 2511 for accommodating the plurality of first magnets 231 (not shown). Three triplets of the first trenches 2511 are shown in FIG. 8A, with each triplet of the first trenches 2511 spaced from other triplets. The first wall mount bracket 251a further includes a first wall 2513a, a second wall 2513b, and a third wall 2513c eccentrically arranged with each other. A plurality of first matching structures 2514 are shown in both FIGS. 8A and 8B, and the first matching structures 2514 are located on the second wall 2513b. As shown in FIGS. 7 and 8B, a second side of the first wall mount bracket 251a includes a plurality of protrusions 2512, a plurality of positioning pins 2512a housed by the protrusions 2512, and a plurality of first matching structures 2514.

Figure 9A:
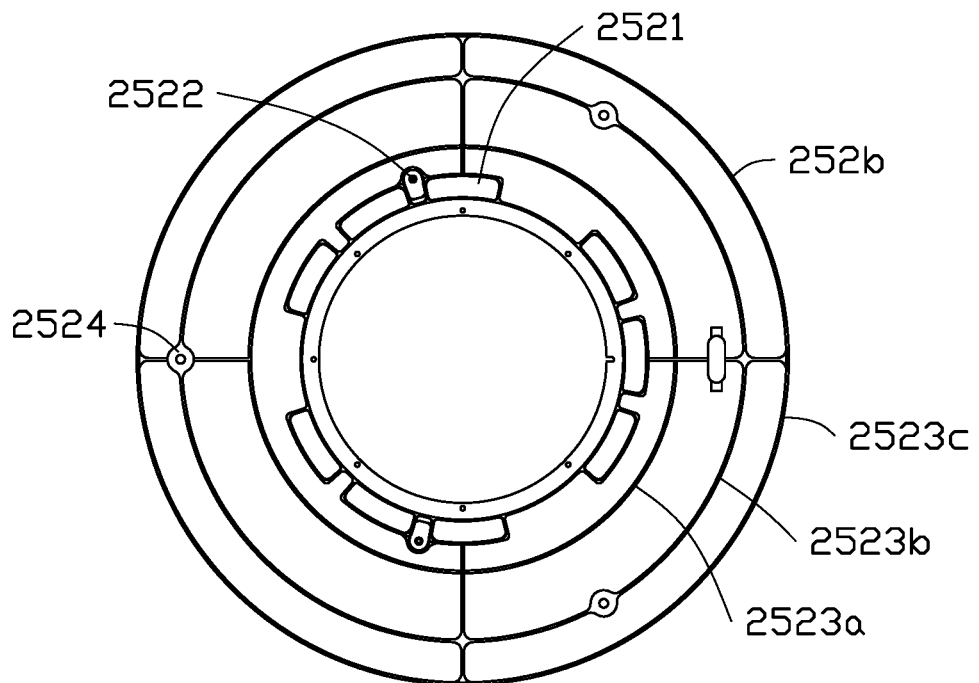
FIG. 9A is a first side of another wall mount bracket of a second kit, in accordance with an embodiment of the present disclosure.
Figure 9B:
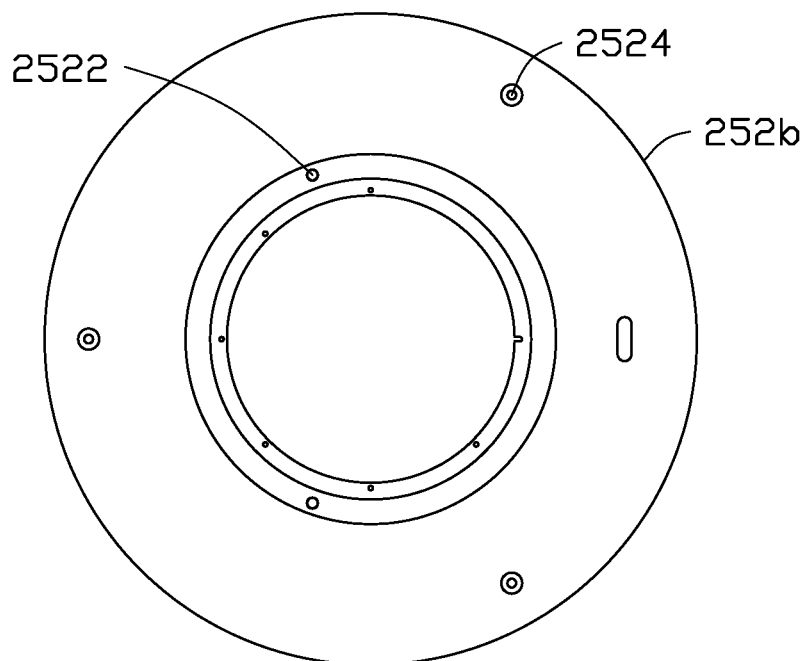
FIG. 9B is a second side of the wall mount bracket of the second kit, in accordance with an embodiment of the present disclosure.

FIGS. 9A and 9B illustrates a first side and a second side of the second wall mount bracket 252b of the second kit 252. Accordingly, because the first wall mount bracket 251a and the second wall mount bracket 252b may be identical in size and structurally similar, the second wall mount bracket 252b has a first side opposite to the second side. Similar to the first kit 251, the first side of the second wall mount bracket 252b of the second kit 252 includes a plurality of circularly arranged second trenches 2521 for accommodating a plurality of second magnets 232 (not shown). Three triplets of second trenches 2521 are shown in FIG. 9A, with each triplet of the second trenches 2521 spaced from other triplets. In an embodiment, each of the triplets of the second magnets 232 on the second kit 252 are spaced apart by a distance that is longer than or equal to the length of one of the second magnets 232, therefore the distance between each of the triplets of the second trenches 2521 corresponds to the length of the second magnets 232. The amount and arrangement of the first magnets 231 on the first kit 251 match (or correspond to) those of the second magnets 232, thereby the first trenches 2512 match (or correspond to) the arrangements of the second trenches 2511. The wall mount bracket 252b further includes a first wall 2523a, a second wall 2523b, and a third wall 2523c eccentrically arranged with each other. A plurality of second matching structures 2524 are shown in both FIGS. 9A and 9B for aligning with the first matching structure 2514 of the first kit 251 when the first kit 251 and the second kit 252 is coupled with each other. As illustrated in FIG. 9B, the second side of the second wall mount bracket 252b of the second kit 252 includes the plurality of second matching structure 2524, and a plurality of recesses 2522 that are structurally complementary and disposed corresponding to the plurality of positioning pins 2512a housed by the protrusions 2512 on the second side of the first kit 251. The positioning pins 2512a of the first kit 251 fit into the recesses 2522 of the second kit 252 when the first kit 251 and the second kit 252 are coupled to each other, therefore facilitating positioning and ensuring stabilization between the first kit 251 and the second kit 252.

Figure 10:
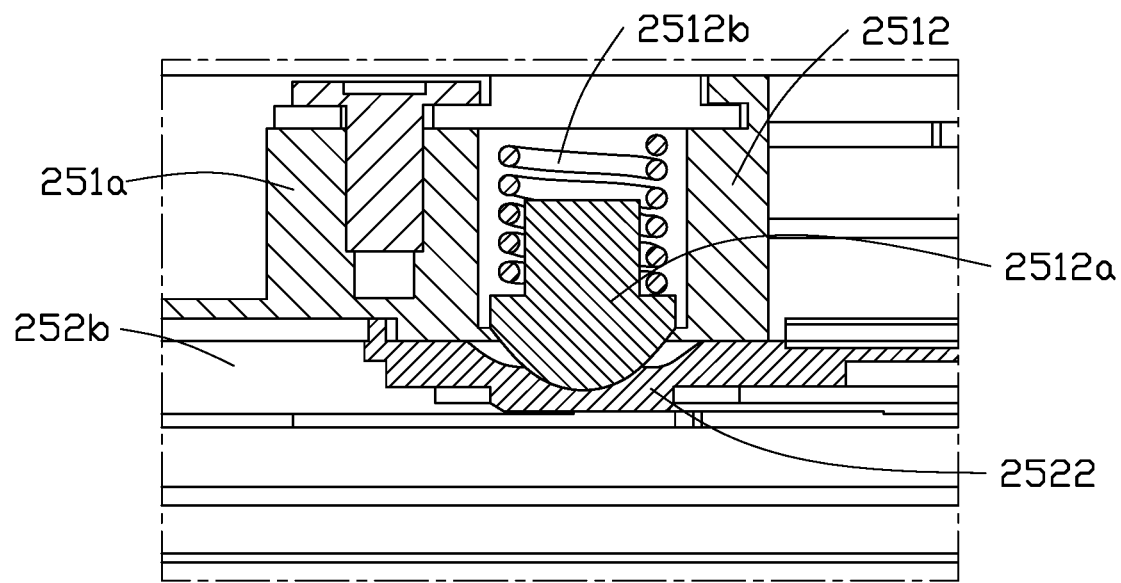
FIG. 10 is a cross-sectional view of a protrusion and a recess, in accordance with an embodiment of the present disclosure.

FIG. 10 illustrates a cross-sectional view of the protrusion 2512 and the recess 2522, in accordance with an embodiment of the present disclosure. Together with FIG. 7, the cross-sectional view of one of the protrusions 2512 shown in FIG. 10 illustrates that the protrusion 2512 accommodates the positioning pin 2512a and an elastic member 2512b, such as a spring, disposed under the positioning pin 2512a. The positioning pin 2512a extends out of the protrusion 2512 when the elastic member 2512b is relaxed, and may be pressed by application of an external force when the elastic member 2512b is shortened. The positioning ping 2512a is partially accommodated by the recess 2522 when the first wall mount bracket 251a of the first kit 251 is coupled to the second wall mount bracket 252b of the second kit 252.

Figure 11:
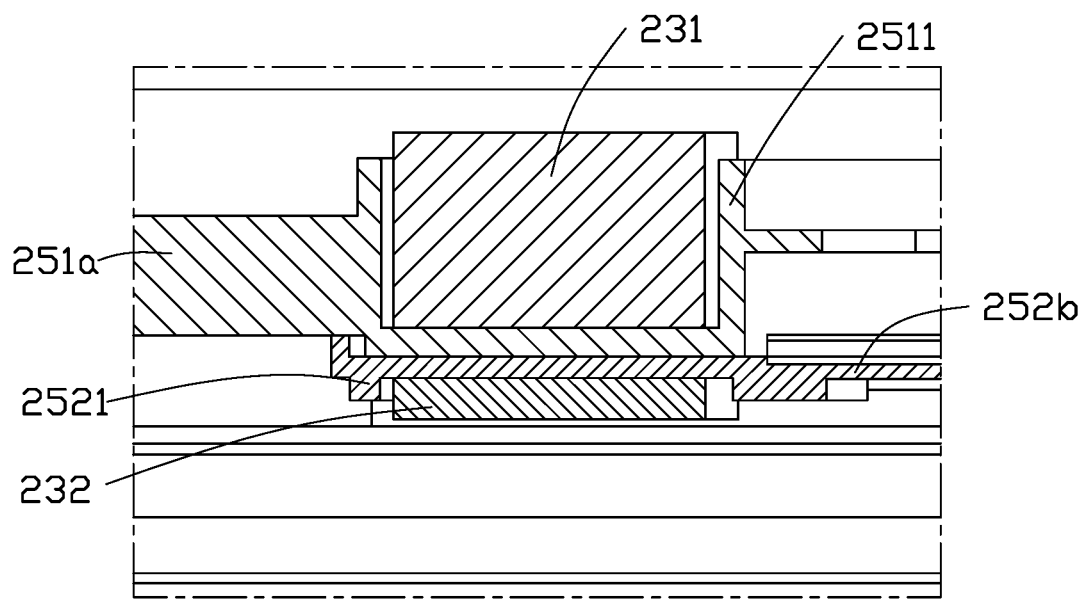
FIG. 11 is a cross-sectional view of two magnets and the wall mount brackets, in accordance with an embodiment of the present disclosure.

FIG. 11 illustrates a cross-sectional view of the first magnets 231 and the second magnets 232, in accordance with an embodiment of the present disclosure. As illustrated by a cross-sectional view of the magnets 231 and 232 in FIG. 11, The first magnet 231 is located corresponds to the second magnet 232 and is accommodated by the first trench 2511 of the first wall mount bracket 251a, and the second side of the first trench 2511 is coupled to the second trench 2521. The second magnet 232 is accommodated by the second trench 2521 of the second wall mount bracket 251b. The first and second magnets 231 and 232 are so arranged that the magnetism of the side of the first magnets 231 facing the second kit 252 is opposite to the magnetism of the side of the second magnets 232 facing the first kit 251, therefore allowing the first kit 251 and the second kit 252 to be removably coupled to each other by magnetic attraction when the first and second magnets 251 and 252 are positioned to face each other. In FIG. 11, a portion of the first magnet 231 can be N pole, and a portion of the second magnet 232 that is closer to the first magnet 231 can be S pole.

In the embodiment, the first kit 251 may be separated from the second kit 252 by loss of magnetic attraction when the first kit 251 is rotated against the second kit 252 for a degree so that the positioning pins 2512a leave the recesses 2522 and the first magnets 231 no longer face the second magnets 232.

In another embodiment, the first and second magnets 231 and 232 are grouped into twins, triplets (as shown in FIG. 8A-9B), quadruplets, or sections of two or more magnets. The sections are spaced apart from each other by a distance that is longer than or equal to the length of one of the magnets. The first and second magnets 231 and 232 are so arranged that the magnetism of each of the magnets on the first kit 251 is opposite to that on the second kit 252 and that the magnetism of any two adjacent magnets in each of the sections are opposite. For example, as illustrated in FIG. 7, the magnets 231 and 232 are grouped into three sections 231a, 231b, and 231c, each section including three magnets; magnetism of the section may be North-South-North (N-S-N) or S-N-S; in a case where one of the section of the magnets on the first kit 251 is N-S-N, a section of the magnetics on the second kit 252 would be S-N-S. Such magnetic arrangement allows the first kit 251 and the second kit 252 to be removably coupled to each other by magnetic attraction when the first magnets 231 are positioned to face the second magnets 232, and that the wall mount assembly 25 is secured by the magnetic attraction, thereby the rear structure 20 and the display panel 10 is firmly attached onto the wall or the rack. In an embodiment, the plurality of sections and intervening spaces may be arranged to avoid deploying magnets at locations of other electronic components that needs special care, such as cables, to prevent possible interference from a magnetic field between the magnets.

Preferably, the first wall mount bracket 251a of the first kit 251 and the second wall mount bracket 252b of the second kit 252 are made of plastic or metallic materials (e.g., aluminum). As exemplified in FIGS. 10 and 11, thickness of the first wall mount bracket 251a may differ from that of the second wall mount bracket 252b. Preferably, thickness of the first wall mount bracket 251a is 1.2 mm, and thickness of the second wall mount bracket 252b is 0.8 mm. Similarly, thickness of the first magnets 231 may differ from that of the second magnets 232. Preferably, thickness of the first magnets 231 is 8 mm, and thickness of the second magnets 232 is 1.8 mm.

Figure 12:
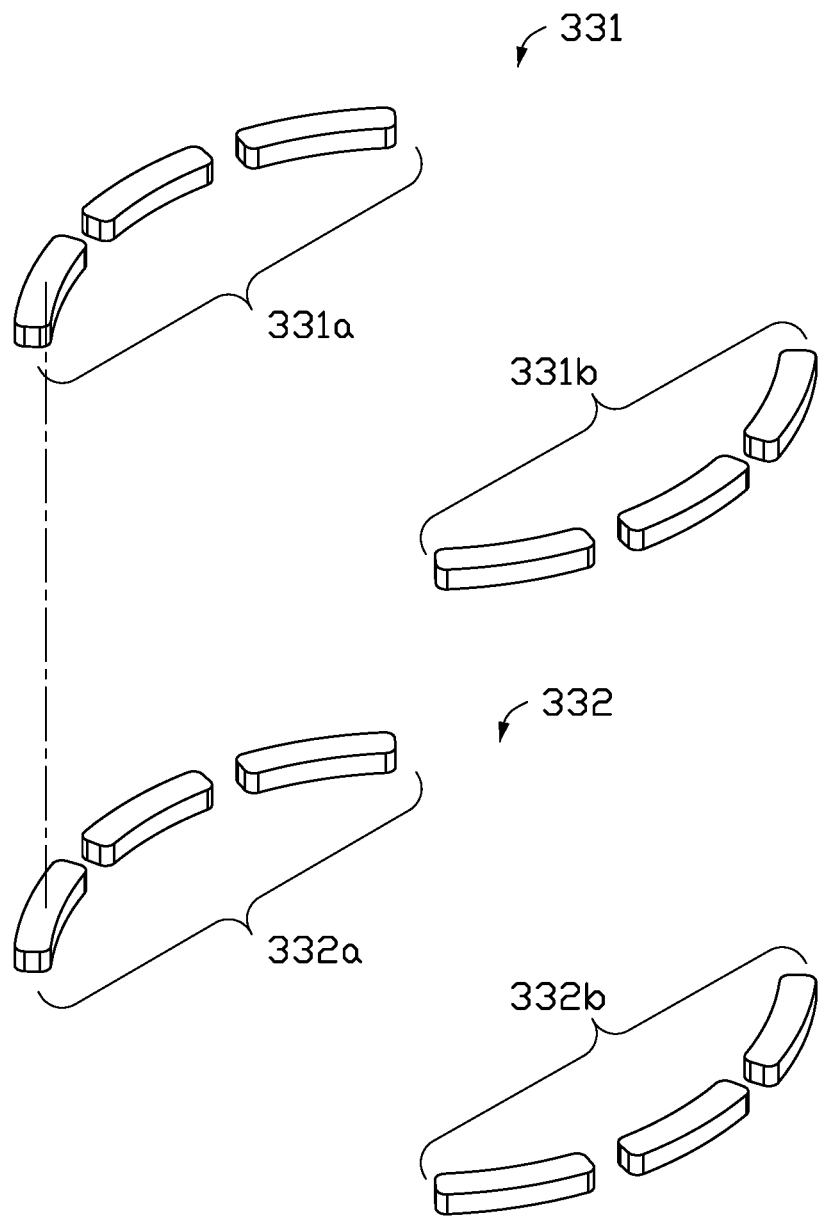
FIG. 12 is an arrangement of the magnets of the wall mount assembly, in accordance with an embodiment of the present disclosure.

FIG. 12 illustrates another arrangements of the magnets of the wall mount assembly, in accordance with an embodiment of the present disclosure. In FIG. 12, the elements of the wall mount assembly are simplified and only magnets are retained. A plurality of first magnets 331 are positioned to face with a plurality of second magnets 332. The first magnets 331 comprises 2 sections: 331a and 331b, and each of the sections comprises 3 magnets. The second magnets 332 also comprises 2 sections: 332a and 332b, and each of the sections comprises 3 magnets. The 3 magnets in section 331a have magnetism of N-S-N, and the section 331a is positioned to face the section 332a, wherein the section 332a have magnetism of S-N-S. The section 331b have magnetism of S-N-S, and the section 331b is positioned to face the section 332b, wherein the section 332b have magnetism of N-S-N. A distance between the section 331a and section 331b is longer than or equal to the length of one of the magnets in the section 331a or section 331b.

Figure 13:
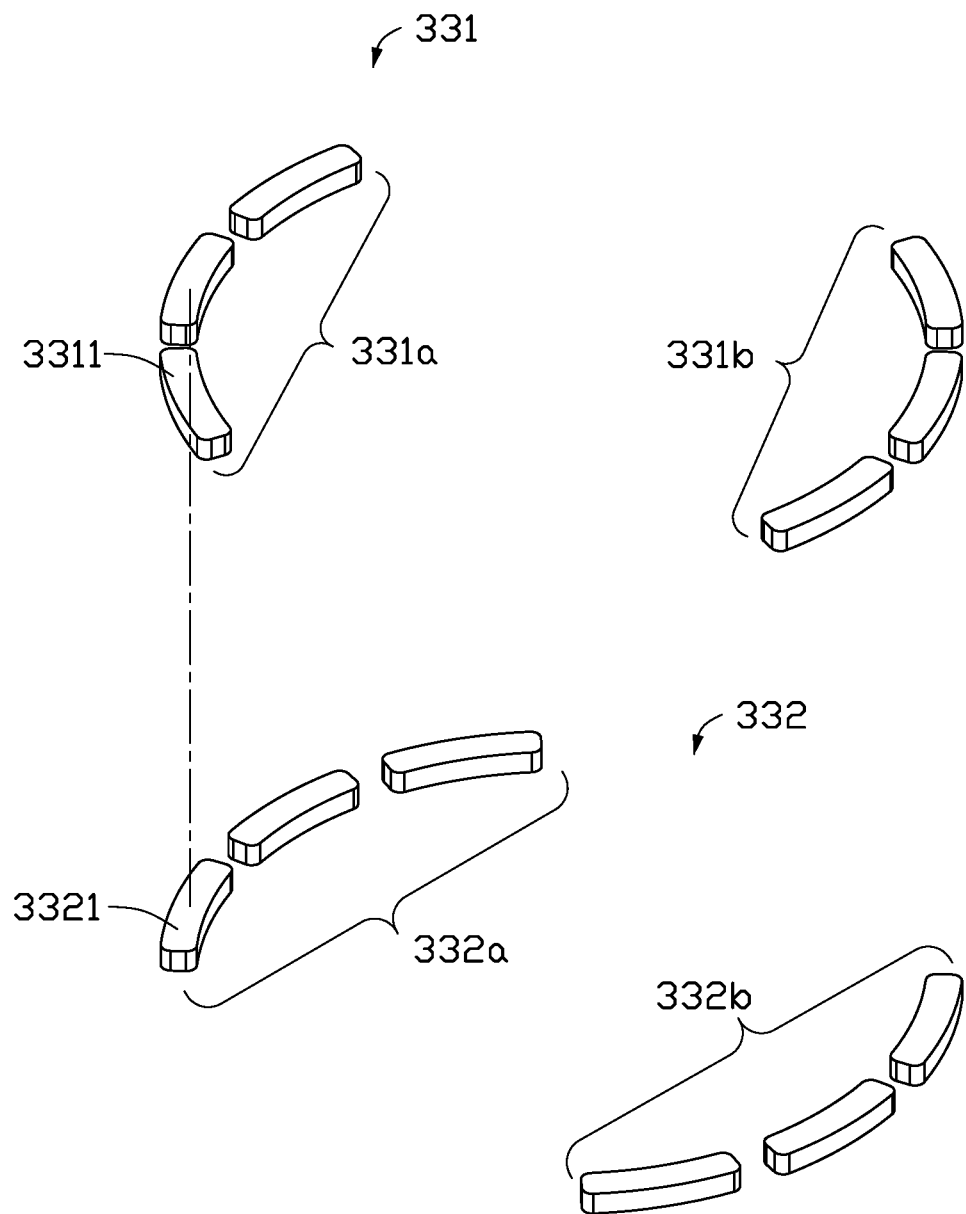
FIG. 13 is another arrangement of the magnets of the wall mount assembly, in accordance with an embodiment of the present disclosure.

In the embodiment, the first kit may be separated from the second kit by magnetic repulsion when the first kit is rotated against the second kit for a degree so that the positioning pins leave the recesses and the magnets on the first kit are shifted to face the magnets having an identical magnetism on the second kit. FIG. 13 illustrates yet another arrangement of the magnets of the wall mount assembly, in accordance with an embodiment of the present disclosure. In FIG. 13, the elements of the wall mount assembly are simplified and only magnets are retained. The first magnets 331 in the section 331a on the first kit is N-S-N and the first magnets 331 in a corresponding section 331b on the second kit is S-N-S, when the first kit is rotated against the second kit for a degree, a first magnet (N) 3311 in the section 331a of the first kit would face a second magnet (N) 3321 in the section 331b of the second kit, and likewise the second magnet (S) in the section 331a of the first kit would face the third magnet (S) in the section 332a of the second kit, therefore generating a repulsive force that facilitates separation of the first and second kits.

Figure 14:
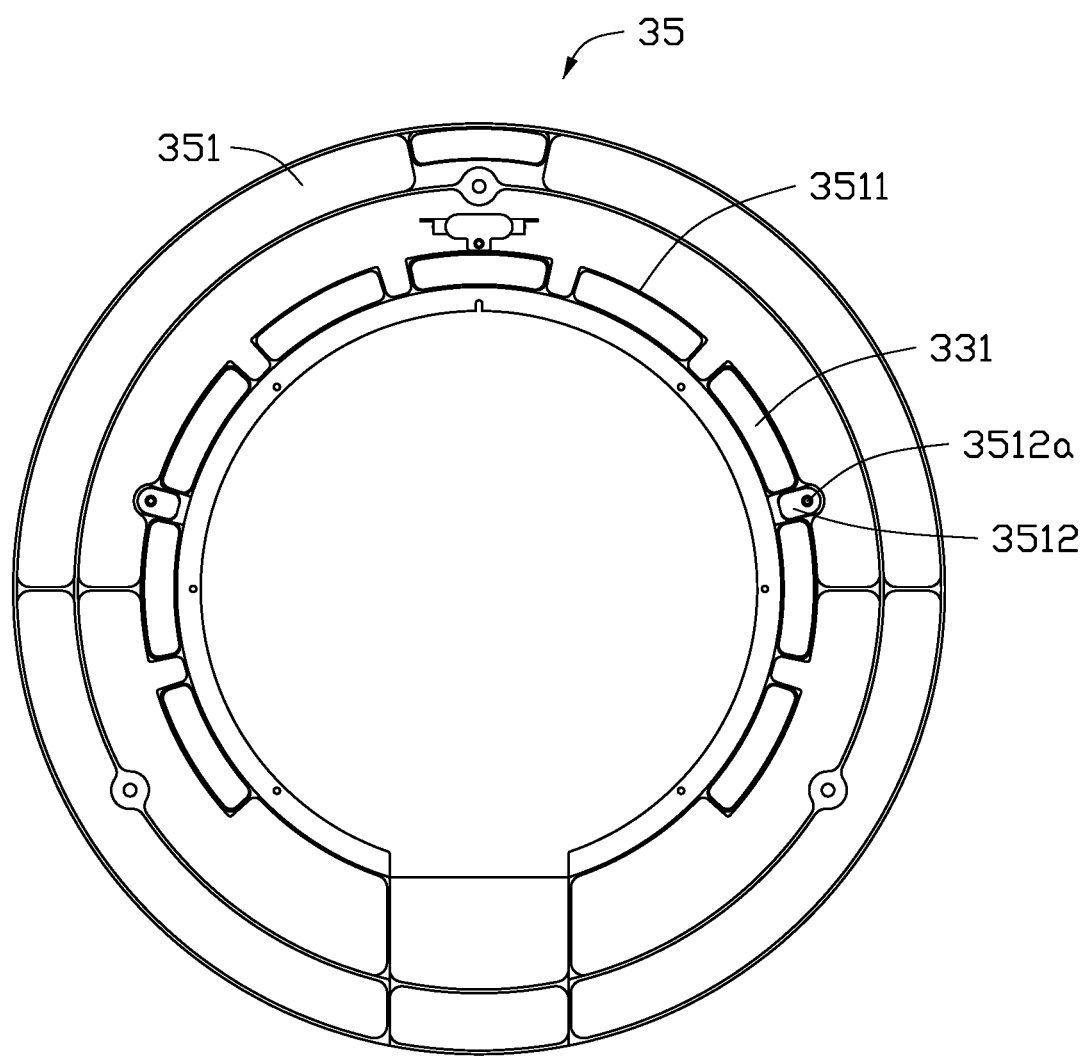
FIG. 14 is another wall mount bracket, in accordance with an embodiment of the present disclosure.

FIG. 14 is a first side of a first kit 351 of a wall mount assembly 35, in accordance with an embodiment of the present disclosure. The first kit 351 comprises a plurality of first trenches 3511, a plurality of first magnets 331, a plurality of protrusions 3512, and a plurality of positioning pins 3512a housed by the protrusions 3512. The first trenches 3511 are grouped to a section of 9 trenches, and the first magnets 331 are grouped into two triplets, wherein a triplet of magnets is housed by 3 trenches and another triplet of magnet is housed by another 3 trenches. Each of the triplets of magnets 331 is spaced with another triplet by the distance of 3 trenches 3511, this configuration enables better fixation for the first kit 351 onto a second kit 352.

The embodiments shown and described above are only examples. Many details are often found in the art. Therefore, many details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure up to, and including the full extent established by the broad general meaning of terms used in the claims. It will therefore be appreciated that the embodiments described above may be modified within the scope of the claims.

What is claimed is:

1. A rear structure coupled to a display panel, comprising: a wall mount assembly comprising a first kit comprising a first wall mount bracket, a plurality of circularly arranged first trenches, and a plurality of first magnets accommodated by the first trenches, and a second kit removably coupled to the first kit comprising a second wall mount bracket structurally complementary to the first wall mount bracket, a plurality of circularly arranged second trenches, and a plurality of second magnets accommodated by the second trenches, wherein when the first kit is coupled to the second kit, each of the first magnets is located corresponds to one of the second magnets, and a magnetism of a side of one of the first magnets facing the second kit is opposite to a magnetism of a side of one of the second magnets facing the first kit.

2. The rear structure of claim 1, wherein the first wall mount bracket further comprises a plurality of protrusions and a plurality of positioning pins housed by the protrusions, and the second wall mount bracket further comprises a plurality of recesses structurally complementary to the positioning pins.

3. The rear structure of claim 2, wherein when the first kit is coupled to the second kit, each of the positioning pins fits into each of the recesses.

4. The rear structure of claim 1, wherein the first wall mount bracket further comprises a plurality of first matching structures, and the second wall mount bracket further comprises a plurality of second matching structures.

5. The rear structure of claim 4, wherein when the first kit is coupled to the second kit, each of the first matching structures is aligned with each of the second matching structures.

6. The rear structure of claim 1, wherein when the first kit is separated from the second kit, the first kit is rotated against the second kit for a degree so that the sides of the first magnets facing the second kit are shifted to face the second magnets having identical magnetisms.

7. The rear structure of claim 1, wherein at least two of the first magnets and the second magnets are grouped into one section, the first magnets and the second magnets are grouped into a plurality of the sections, and the sections are spaced apart from each other by a distance that is longer than or equal to the length of one of the first magnets or the second magnets.

8. The rear structure of claim 7, wherein magnetisms of any two adjacent magnets within the section is different.

9. A wall mount assembly coupled to a rear structure, comprising:
a first kit comprising a first wall mount bracket, a plurality of circularly arranged first trenches, and a plurality of first magnets accommodated by the first trenches, and
a second kit removably coupled to the first kit comprising a second wall mount bracket structurally complementary to the first wall mount bracket, a plurality of circularly arranged second trenches, and a plurality of second magnets accommodated by the second trenches,
wherein when the first kit is coupled to the second kit, each of the first magnets is located corresponds to one of the second magnets, and a magnetism of a side of one of the first magnets facing the second kit is opposite to a magnetism of a side of one of the second magnets facing the first kit.

10. The wall mount assembly of claim 9, wherein the first wall mount bracket further comprises a plurality of protrusions and a plurality of positioning pins housed by the protrusions, and the second wall mount bracket further comprises a plurality of recesses structurally complementary to the positioning pins.

11. The wall mount assembly of claim 10, wherein when the first kit is coupled to the second kit, each of the positioning pins fits into each of the recesses.

12. The wall mount assembly of claim 9, wherein the first wall mount bracket further comprises a plurality of first matching structures, and the second wall mount bracket further comprises a plurality of second matching structures.

13. The wall mount assembly of claim 12, wherein when the first kit is coupled to the second kit, each of the first matching structures is aligned with each of the second matching structures.

14. The wall mount assembly of claim 9, wherein when the first kit is separated from the second kit, the first kit is rotated against the second kit for a degree so that the first magnets are shifted to face the second magnets having identical magnetisms.

15. The wall mount assembly of claim 9, wherein at least two of the first magnets and the second magnets are grouped into one section, the first magnets and the second magnets are grouped into a plurality of the sections, and the sections are spaced apart from each other by a distance that is longer than or equal to the length of one of the first magnets or the second magnets.

16. The wall mount assembly of claim 15, wherein magnetisms of any two adjacent magnets within the section is different.

* * * * *